United States Patent [19]

Schoering

[11] Patent Number: 4,464,035
[45] Date of Patent: Aug. 7, 1984

[54] PROCESSING UNIT FOR DEVELOPING PHOTOSENSITIVE MATERIALS

[75] Inventor: Eberhard Schoering, Taunusstein, Fed. Rep. of Germany

[73] Assignee: Hoechst Aktiengesellschaft, Frankfurt am Main, Fed. Rep. of Germany

[21] Appl. No.: 443,906

[22] Filed: Nov. 23, 1982

[30] Foreign Application Priority Data

Nov. 27, 1981 [DE] Fed. Rep. of Germany ....... 3147002

[51] Int. Cl.³ .......................... G03D 3/06; G03D 3/08
[52] U.S. Cl. .................................... 354/299; 354/322; 354/325; 15/77; 118/419
[58] Field of Search ............... 354/317, 318, 319, 320, 354/321, 322, 325, 299; 15/77, 102; 118/419

[56] References Cited

U.S. PATENT DOCUMENTS

| | | | |
|---|---|---|---|
| 2,232,998 | 2/1941 | Cernohouz et al. | 354/299 |
| 2,400,675 | 5/1946 | Wyllie | 354/299 |
| 2,551,892 | 5/1951 | Mitchell | 354/299 |
| 2,981,171 | 4/1961 | Hruby et al. | 354/318 |
| 3,509,809 | 5/1970 | Limberger et al. | 354/320 |
| 3,562,834 | 2/1971 | Stievenart et al. | 15/100 |
| 3,610,131 | 10/1971 | Frick et al. | 354/319 |
| 3,732,808 | 5/1973 | Graham | 101/463 |
| 3,833,918 | 9/1974 | Stievenart et al. | 354/321 |
| 3,916,426 | 10/1975 | Bown | 354/319 |
| 4,099,194 | 7/1978 | Kummerl | 354/321 |
| 4,312,587 | 1/1982 | Ariga et al. | 355/8 |
| 4,353,635 | 10/1982 | Tanaka | 354/320 |
| 4,354,755 | 10/1982 | Becheiraz | 354/322 |
| 4,367,030 | 1/1983 | Raymond | 354/322 |
| 4,383,751 | 5/1983 | Schornig et al. | 354/322 |

FOREIGN PATENT DOCUMENTS

| | | |
|---|---|---|
| 1263507 | 3/1968 | Fed. Rep. of Germany . |
| 8028682 | 10/1980 | Fed. Rep. of Germany . |
| 1276383 | 6/1972 | United Kingdom . |
| 1465813 | 3/1977 | United Kingdom . |

OTHER PUBLICATIONS

European Search Report 32110660.6, Jan. 4, 1984.

Primary Examiner—A. A. Mathews
Attorney, Agent, or Firm—Schwartz, Jeffery, Schwaab, Mack, Blumenthal & Koch

[57] ABSTRACT

Disclosed is a processing unit with three treatment zones for photosensitive materials which are exposed imagewise, especially printing plates, comprising a housing top part which can be lifted off from a housing bottom part. Located on the housing top part are two separate run-in tables inclined obliquely downwardly which lead into feed slits. One run-in table can be folded against the front plate, whereas the other run-in table is integrated into the top side of the housing top part. Located on the rear side of the housing top part is a discharge slit with a run-out table inclined obliquely downwardly, which is equipped with an adjustable stop and which can be folded against the rear side of the processing unit. A heated air stream flows through an air outflow slit against the underside of the run-out table.

20 Claims, 12 Drawing Figures

PROCESSING UNIT FOR DEVELOPING PHOTOSENSITIVE MATERIALS

BACKGROUND OF THE INVENTION

The present invention relates to a processing unit for photosensitive materials which are exposed imagewise, and more especially to a unit for processing printing plates. The unit has at least two treatment zones in which are located removable tank inserts which contain transport and guide devices for the continuous arcuate and linear guidance of the material through the treatment zones. In the first treatment zone there is a developing device having a cover which projects partially into the treatment fluid.

Known developing units having trough-shaped immersion baths in a double-chamber combination can be used, in general, as continuous-feed table units or as floor-standing units for the fully automatic developing of photographic papers, printing plates or the like. In such use, the difficulty often arises that the materials to be developed are curved undesirably and have scratches on the top side and/or bottom side after they have passed through the apparatus. In addition, the degree of developing is not satisfactory. In the case of continuous use for a relatively long time, the treatment baths frequently also start to foam, so that developing has to be interrupted in order to change the developer and add anti-foam agents, or the processing speed has to be reduced. It also happens frequently that the processed materials leave the unit still wet, that is to say not sufficiently squeezed out, so that a further drying step is still required.

To avoid these disadvantages, German Utility Model No. 8,028,682 proposes a developing unit having a two-tank combination, in which a rotating brushing roller having a resiliently mounted counter-roller is located in front of the outflow region of the developer tank, the brushing roller being covered by a protective hood, the rear bottom edge of which, seen in the feed direction, extends to below the level of the developer fluid. For transporting the material through the two tanks, in addition to the pairs of transport rollers, the unit includes rotatable deflecting rollers on the sensitized side and fixed guide means on the rear side. In the transition region between the developer tank and aftertreatment tank, the unit contains pairs of run-out and run-in rollers which guide the treated material by means of deflecting rollers in such a way that its rear surface does not graze the separating wall between the two tanks, with the result that undesirable scratching on the processed material is avoided.

U.S. Pat. No. 3,732,808 discloses a developing apparatus for offset printing plates which includes devices, by means of which both sides of one offset printing plate or one side each of two individual offset printing plates, resting back-to-back against one another, can be developed at the same time. The developing unit incorporates devices which simultaneously apply developer solution to the surfaces of the printing plate located opposite one another, and also brushing devices which simultaneously brush the two surfaces so as to assist the chemical reaction of the developer solution, as well as washing devices for removing the developer solution from the opposing surfaces of the printing plate, and drive devices for transporting the printing plate through the unit. The unit does not make use of an immersion bath in the developer part, so that the printing plate can be guided through the unit in a straight line. Only developing and cleaning steps are possible, but not preservation.

SUMMARY OF THE INVENTION

It is therefore an object of the present invention to provide an improved processing unit for photosensitive materials.

It is a particular object of the invention to provide a compact processing unit for developing the materials to be processed on both sides in the immersion bath and for washing and preserving them.

Another object of the invention resides in providing such a processing unit wherein the bottom side and top side of the materials are processed simultaneously.

A further object of the invention is the provision of a processing unit which allows careful and uniform treatment of both sides of the materials without any adverse surface variations and de-formations.

In accomplishing the foregoing objects, there has been provided in accordance with the present invention a processing unit for photosensitive materials which have been exposed imagewise, comprising an integral tank bottom member having at least three recesses adapted to receive tank inserts for three separate tanks to define three separate treatment zones for the photosensitive materials, one treatment zone in each tank, these tanks being adapted to receive and hold a treatment fluid for each treatment zone; means positioned in each of the treatment zones for applying a treatment fluid to both the top and bottom sides of the photosensitive material, wherein the applying means in the first treatment zone includes a cover which projects partially into the treatment fluid contained in the first tank; and means, attached to inserts which are selectively removable from each of the tanks, for transporting and guiding the photosensitive material through the treatment zones in a continuous manner, these guiding and transporting means including means for guiding the photosensitive material in a substantially straight line in the region of the means for applying treatment fluid in each of the treatment zones.

Further objects, features and advantages of the present invention will become apparent from the detailed description of preferred embodiments which follows, when considered together with the attached figures of drawing.

BRIEF DESCRIPTION OF THE DRAWINGS

In the drawings:

Figure 1A is a detailed perspective view of a run-out table of the processing unit according to FIG. 1;

DETAILED DESCRIPTION OF PREFERRED EMBODIMENTS

Figure 1:
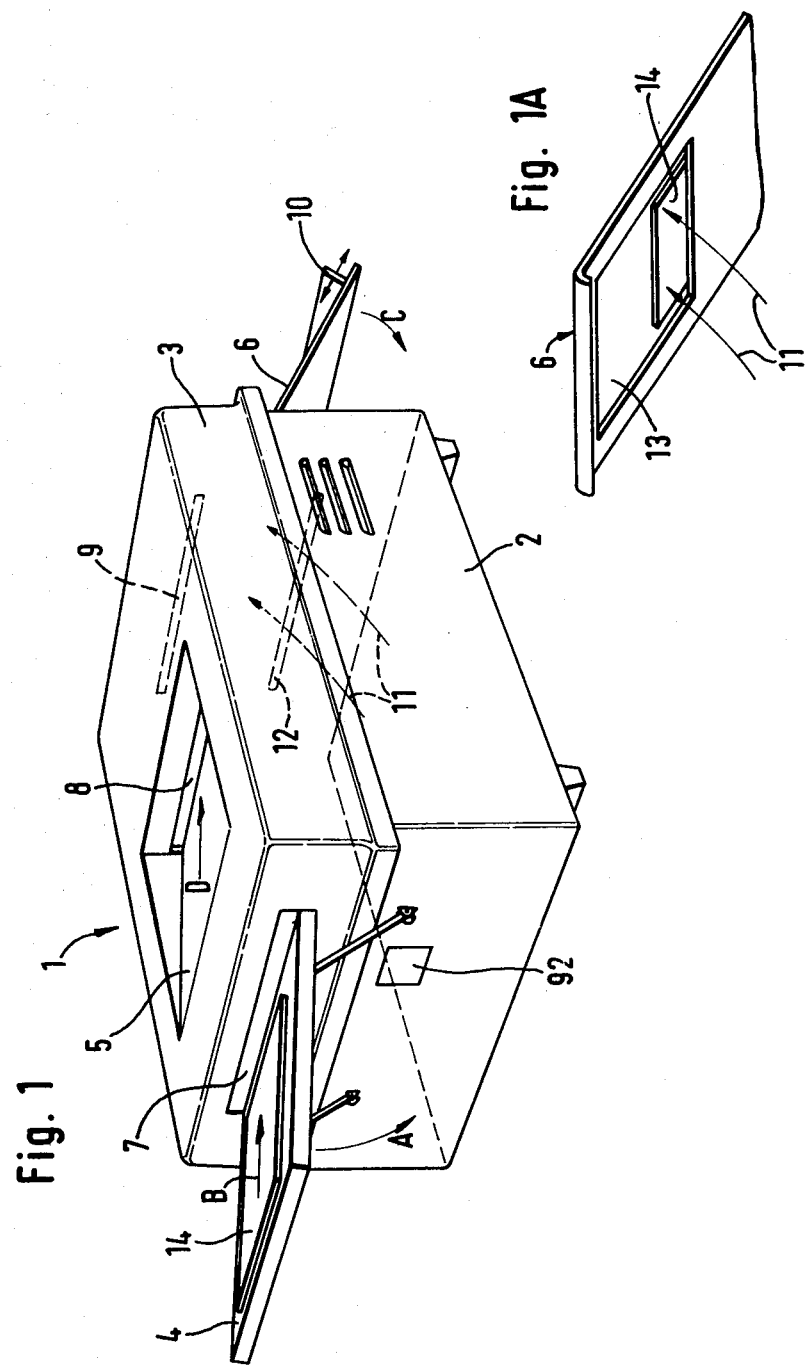
FIG. 1 is a perspective view of a processing unit according to the invention.

In the processing unit of the invention, there is a third treatment zone with a removable tank insert. A tank bottom part is made integral and receives the tank inserts of the three treatment zones, and in each of the treatment zones the treatment fluids are applied to the top and bottom sides of the material to be developed. The material is guided in a straight line, within each treatment zone, in the region of application for the particular treatment fluid.

The invention achieves the advantage that a compact, inexpensive three-chamber unit for material widths up to 700 mm makes it possible to carry out all the processing steps under the best possible conditions, and furthermore, that corrections can be made quickly to the developing materials before preservation, without it being necessary for these to pass through the developing zone as they are fed through the unit for a second time.

The invention is explained in more detail below with reference to exemplary embodiments illustrated in the drawings.

The processing unit 1 illustrated in perspective in FIG. 1 consists of a housing bottom part 2 and a housing top part 3 which can be lifted off from the housing bottom part 2. In the front plate of the housing bottom part 2 there is a filling-level indicator panel 92, from which the particular fluid level of the various fluid baths in the interior of the processing unit 1 can be read. Located in the housing top part 3 are two separate feed slits 7 and 8 with run-in tables 4 and 5 inclined obliquely downwardly. The material 14 to be processed, for example, a printing plate exposed imagewise, is pushed into the feed slit 7 in the direction of the arrow B or into the feed slit 8 in the direction of the arrow D. The run-in table 4 is attached pivotably to the front side of the housing top part 3 and, when the processing unit 1 is stopped, is swung in the direction of the arrow A so as to reduce the space requirement. The run-in table 5 is integrated into the top side of the housing top part 3 and, like the run-in table 4 in the swung-out position, extends slightly obliquely downwardly. The angle of these two tables relative to the horizontal is from about 5° to 25°. Located on the rear side of the housing top part 3 is a discharge slit 9 for the material 14 to be processed, through which the latter passes onto a run-out table 6, which is fastened to the rear side of the housing top part 3. The run-out table 6 is inclined obliquely downwardly and is equipped with an adjustable stop 10. During the time when the processing unit 1 is stopped, the run-out table 6 can be swung against the rear side of the processing unit 1 in the direction of the arrow C.

In the housing bottom part 2 there is an air outflow slit 12 from which a heated airstream 11 (indicated by broken lines in FIG. 1) flows and strikes against the underside of the run-out table 6. The airstream is produced by a ventilation fan, as will be described in more detail below.

Located in the side wall of the housing bottom part 2 are gill orifices or air slits through which air flows into the interior of the processing unit 1 and is carried along by the cold air sucked in by the ventilation fan. These air slits can be located anywhere in the side wall of the housing bottom part 2, not just in the position shown in FIG. 1 near the rear side of the processing unit 1.

Figure 1A shows a bottom view of the runout table 6, which has an opening 13 which extends over its entire width and through which the airstream 11 flows. The adjustable stop 10 of the run-out table 6 is positioned for the front edge of the material 14 in such a way that the rear edge of the material 14 comes to rest over the opening 13. This ensures that the airstream 11 flows over both a portion of the rear side and the rear edge of the material 14 and consequently dries off the residual treatment fluid on the material 14. As a result, satisfactory drying of the material 14 is achieved before it is taken off from the run-out table 6.

Figure 2:
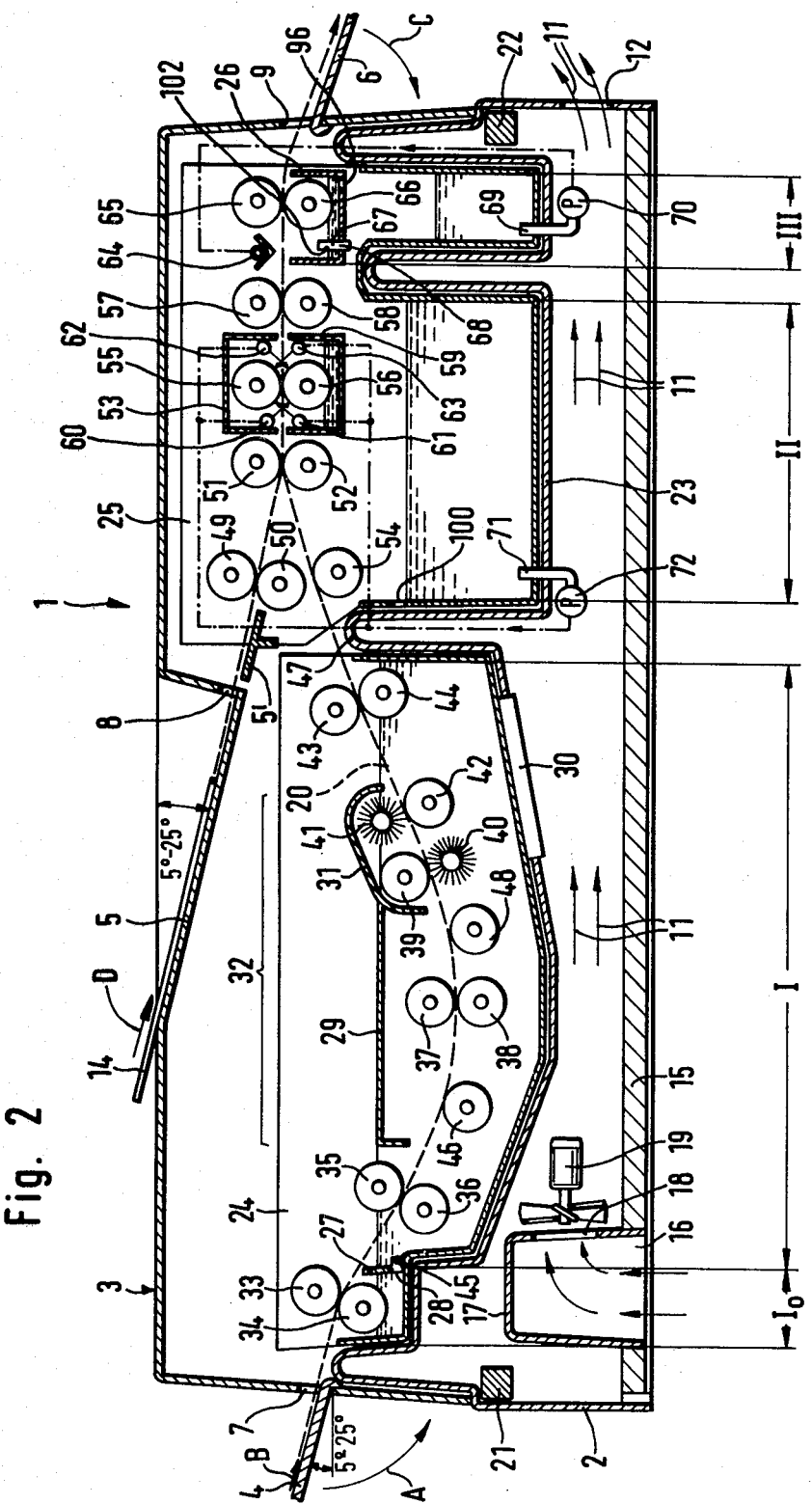
FIG. 2 is a diagrammatic cross-sectional view taken through an embodiment of the processing unit according to FIG. 1.

The embodiment of the processing unit illustrated in FIG. 2 incorporates a pretreatment zone or pre-chamber $I_o$ and three treatment zones I, II and III. The sheet-shaped material 14 to be processed, for example, a printing plate exposed imagewise or a printing plate with a fixed toner pattern, wherein the carrier of the printing plate is metallic or non-metallic and consists of aluminum, paper or plastic, is pushed over the obliquely downwardly inclined run-in table 4 in the direction of the arrow B, into the interior of the processing unit 1 via the feed slit 7. The transport devices of the processing unit 1 can be switched on either by means of a foot switch (not shown) or a proximity switch located in the surface of the run-in table 4. The material 14 to be processed is transported through the individual zones of the processing unit 1 along a material path 20 indicated by a broken line. Materials with a web width up to 700 mm and a thickness up to 0.8 mm can be processed, but processing of wider and thicker materials is also possible. The material 14 to be processed can be developed, washed and preserved, both on the top side and on the bottom side simultaneously. For this reason, the run-in table 4 is also provided with a special covering for materials to be processed on both sides, this covering ensuring that the places exposed imagewise, or, respectively, the developed image on the underside of the materials to be processed will not be damaged.

The frame of the processing unit 1 consists of a base plate 15 and supports 21 and 22 which carry the housing bottom part 2. This housing bottom part 2 is designed, in the interior of the processing unit 1, as a tank bottom part 23 which is formed, for example, as a deep-drawn article and which receives, for example, tanks with the fluid baths or tank inserts or rack inserts for material treatment and material transport. In the base plate 15 there is an orifice 16 through which air flows into an air guide channel 17. In a side wall of the air guide channel 17 there is an orifice 18 and adjacent to this a ventilation fan 19 is located outside the ventilation channel 17. The air flowing into the air guide channel 17 through the orifice 16 is heated by the ventilation fan 19 and guided along as an air stream 11 underneath the tank bottom part 23, and it flows upwardly out of the air outflow slit 12 in the region of the runout table 6. Because the power of the ventilation fan 19 is adjustable in steps, a sufficient degree of drying of the material 14 to be processed can be achieved before it passes onto the run-out table 6.

The material 14 introduced into the processing unit 1 first passes into the pretreatment zone or pre-chamber $I_o$ in which a pair of run-in rollers 33, 34 is located. The pre-chamber $I_o$ is separated from the developer fluid bath in the first treatment zone I by a separating web 27 containing orifices 28 which can be closed by plugs 45. When these plugs 45 are removed, the same fluid level as in the first treatment zone I is established in the pre-chamber $I_o$, so that the lower run-in roller 34 dips into the developer fluid and moistens the upper developer roller 33, with the result that preliminary development of the material 14 takes place by means of the run-in rollers 33 and 34 which are wetted with developer. If such preliminary development is not desired, the orifices 28 are closed by the plugs 45, so that there is no developer fluid in the pre-chamber $I_o$, and the pair of run-in rollers 33, 34 merely transports the dry material 14 further. The tank bottom part 23 is made trough-shaped in the treatment zone I and receives a tank 24 or a tank insert which contains, among other things, the separating web 27 and all the racking devices of the first treatment zone I and the pre-chamber $I_o$. During further transport of the material 14 along the material path 20, a pair of transport rollers 35, 36 grasps the front edge of the material in the curved portion of the material path 20 and conveys it further in the form of an arc. To support the material 14 there is a support roller 46 which has no counter-roller opposite it. Located at the lowest point of the material path 20 in the treatment zone I is a pair of deflecting rollers 37, 38 which deflects the material 14 obliquely upwardly from the curved path, so that it runs through the brushing rollers in a straight line. Connected after the pair of deflecting rollers 37, 38 is a further support roller 48, adjacent to which is a device for applying the developer fluid to the material 14. This application device consists of brushing rollers 40, 41 located respectively underneath and above the ascending material path 20, with associated counter-rollers 39 and 42, respectively. These brushing rollers 40, 41 revolve at a predetermined speed of, for example, 150 revolutions per minute, different from the material transport speed. At the same time, the brushing rollers 40, 41 rotate in the direction of transport of the material 14. The counter-rollers 39 and 42 corresponding to the brushing rollers are driven only at the material transport speed and are, for example, rubber rollers. The tank bottom part 23 or the tank insert 24 is inclined in a straight line upwardly underneath the application device consisting of the brushing rollers and of the counter-rollers and contains a heating device 30 which ensures temperature control of the fluid in a range from about 20° to 30° C.

This heating device 30, which is described below in more detail, has a large heat-exchange surface and, at the same time, a relatively low electrical heating capacity. This ensures, especially in the case of solvent-containing developers, that local overheating remains low and that a circulating pump for the fluid bath, which is normally switched on during the time when the unit is stopped, is not required, since lumps do not form in the developer fluid because of the low local overheating. The arrangement of the brushing rollers, together with the driven counter-rollers, where the material runs through in a straight line, allows specific brushing of the top and bottom sides of the material. Because the brushing roller 40 on the same side as the trough is arranged first, the different wetting intensities of the top and bottom sides of the material 14 obtained in the case of preliminary development by means of run-in rollers 33 and 34 wet with developer are compensated.

A cover 32, which, at the same time, also forms a displacement body for the developer fluid, makes it possible to achieve perfect developing with less developer fluid in the fluid bath. Cover 32 extends from the pair of transport rollers 35, 36 to behind the brushing roller 41, and consists of a horizontal part 29 and an upwardly-inclined sloping part 31 surrounding the brushing rollers 40, 41 and their counter-rollers 39, 42. The edges of the cover 32 dip into the fluid bath, the horizontal part 29 generally projecting further from the fluid bath, i.e., higher than the fluid level, than shown in FIG. 2. The cover considerably reduces the free surface of the fluid bath, with the result that the useful life of the developer is increased, since the developer fluid absorbs, for example, less oxygen and/or carbon dioxide from the ambient air. Since the cover 32 is also, at the same time, a displacement body for the developer fluid, less developer fluid is required for the immersion bath in the tank insert 24. Solutions which can be considered as developer fluids are those which contain inorganic and-/or organic alkaline substances in water and/or organic solvents. Thus, in addition to conventional developing processes, it is also possible, for example, to remove fixed toner image layers produced electro-photographically. By means of the brushing rollers 40 and 41, good full development of the surfaces of the material 14 takes place, and furthermore, the bristles of the brushing rollers, for example, attached helically, cause circulation of the bath. After the material 14 has left the brushing-roller device, it is grasped by the transport rollers 43, 44 at the run-out from the treatment zone I, and the developer fluid adhering to the surfaces is substantially squeezed off by these rollers. A wall 47 separates the treatment zone I from the treatment zone II, and the material 14 is transported in a straight line and obliquely upwardly, without contact, into the treatment zone II over this separating wall 47. The treatment zone II contains a tank or a tank insert 25 having two troughs, one of which contains water as a treatment fluid and the second of which contains a preserving fluid, for example, for gumming the finally developed material 14.

The material 14 entering the treatment zone II is conveyed by rollers 50, 54 to a pair of deflecting rollers 51, 52. From the pair of deflecting rollers 51, 52, the material 14 runs horizontally into a fluid-coating chamber 53 and is conveyed centrally through the latter. In the fluid-coating chamber 53 there are two pairs of spray tubes 60, 61 and 62, 63 which are located near to the entrance and exit of the material path 20. A coating of water is applied for the first time on both sides via the spray tubes 60, 61 and 62, 63, respectively, in the horizontal region of the fluid-coating chamber. After the first application of water to the material 14, the rinsing water is squeezed off by a pair of squeeze rollers 55, 56, located between the two pairs of spray tubes, and subsequently rinsing water is applied on both sides for the second time by the pair of spray tubes 62, 63. The best possible rinsing effect is achieved as a result of the double application of water and the squeezing-off carried out in between. The squeeze roller 56 located underneath the material path 20 dips into the fluid bath of the fluid-coating chamber 53. The tank of the coating chamber has an overflow 59 which ensures a constant fluid level in the coating chamber 53. The rinsing water overflowing from the fluid-coating chamber 53 is collected by the trough of the tank insert 25 located under the water bath. This trough possesses likewise an overflow 100 which ensures a constant fluid level within the trough when it is replenished with rinsing water from the heating device 30.

A suction pipe 71 of a pump 72 with an electric drive projects into the fluid bath of the tank insert 25 in the treatment zone II. This pump 72 is indicated only diagrammatically in FIG. 2, as is the connection from this pump 72 to the spray tubes 60, 61 and 62, 63, respectively.

Figure 4A:
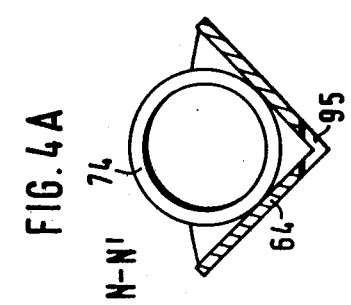
FIG. 4A is a cross-sectional view taken along the line N—N in FIG. 4.
Figure 4:
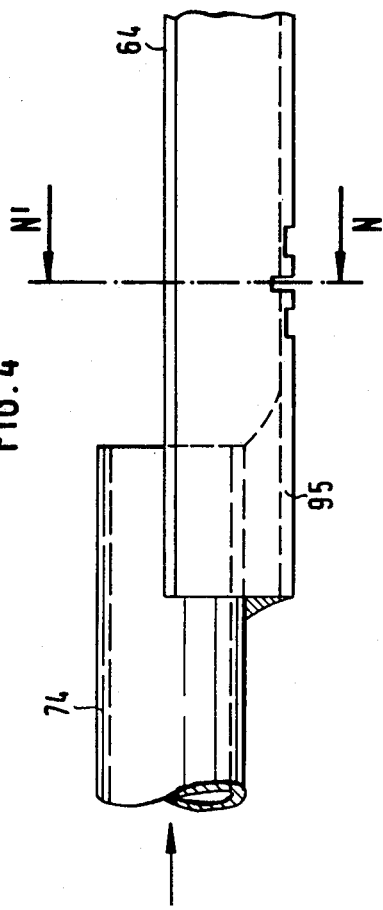
FIG. 4 is a detailed plan view of structure in one of the treatment zones of the processing unit.

After the material 14 has left the fluid-coating chamber 53, it is grasped by a further pair of squeeze rollers 57, 58 and transported into the third treatment zone III, in which there is located above the material path 20 a nozzle-less channel 64 which has a V-shaped cross-section with slits 95 (see FIGS. 4 and 4A, section N-N'). Treatment fluid is applied to the material 14 via the channel 64. This treatment fluid serves for preserving the material 14, for example, by gumming. In the treatment zone III, the plate feed plane or the material path 20 is oriented flatly in the run-out direction. A pair of run-out rollers 65, 66 is located after the channel 64, the lower run-out roller 66 dipping into the tank insert 26 filled with treatment fluid and serving as a roller for coating the treatment fluid onto the underside of the plate. The tank is provided with a bottom drain 67 which is closed by a plug 68. The plug 68 has a drain port 102 for a specific fluid level within the tank insert 26. The plug 68 is removed for cleaning and draining the treatment fluid. In addition, the tank insert 26 has at its lowest point an orifice 96, the cross-section of which is such that when the tank insert 26 is empty and the pump delivery is at its lowest, the treatment fluid flowing off from the channel 64 fills the tank insert during the time until a printing plate introduced into the processing unit 1 reaches the pair of run-out rollers 65, 66. The treatment fluid dripping off from the channel 64 and overflowing is collected in the tank insert 26, which is open at the top and can be removed from the region of the third treatment zone III.

In each of the treatment zones I to III, the rollers, side parts, pumps and spray tubes can be extracted upwardly after a drive coupling (not shown) has been released, so as to render the tank inserts or troughs accessible for cleaning purposes.

The material 14 leaves the processing unit 1, preserved on both sides and squeezed-off by the pair of run-out rollers 65, 66, and passes onto the run-out table 6. As already mentioned before, hot air is blown from below against the rear side of the material by the ventilation fan 19. In addition, a hot-air fan with a heating capacity adjustable in steps can also be provided, so as to achieve a sufficient degree of drying of the material 14 before the latter slips onto the runout table 6.

The slow-down operation of such a hot-air fan and of further components of the processing unit 1 is controlled in a conventional way by a timing relay. For a minimum switching-on time of the processing unit 1, a set-point device for the feed speed of the material 14 can be coupled mechanically to a set-point device of the timing relay. From the start of the processing unit which takes place by means of a foot switch or proximity switch, the correct slow-down time is consequently controlled or adjusted automatically, depending on the selected transport speed of the material 14.

When printing plates, for example, especially positive printing plates, are processed, a separate preserving operation is required after necessary corrections have been made to the developed plate. For this purpose, the processing unit 1 has the run-in table 5 which opens into the feed slit 8. Printing plates pushed in here are transported virtually in a straight line, without permanent deformation, in the direction of the treatment zone II. For this purpose, as a prolongation of the running table 5, there is a part 5' resembling a T which ensures that the relatively thin printing plate is transported further in a straight line after passing through the feed slit 8. The printing plate is grasped by a pair of rollers 49, 50 and, via the pair of deflecting rollers 51, 52, fed to the fluid-coating chamber 53.

Figure 3:
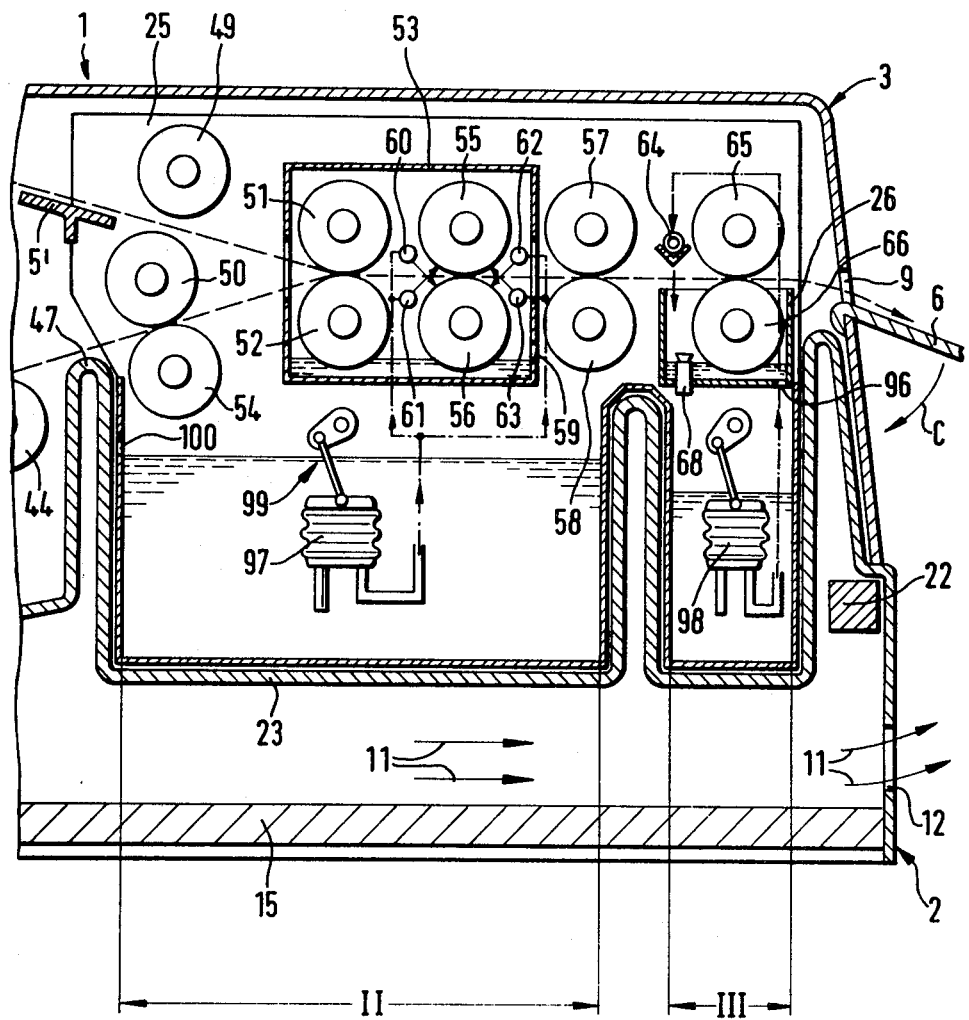
Figure 3 is a diagrammatic cross-sectional view taken through a further embodiment of the processing unit according to FIG. 1.

A further embodiment of the processing unit 1 according to the invention is shown in FIG. 3, in which the first treatment zone I, which is identical to the embodiment according to FIG. 2, has been omitted for the sake of greater clarity. Identical components of the two embodiments bear the same reference numerals. The preferred embodiment according to FIG. 3 differs from the embodiment according to FIG. 2 in that, instead of pumps having an electric drive which are located outside and underneath the tank bottom part 23, there are bellows pumps which are located within the fluid baths of the second and third treatment zones II and III, respectively. Thus, for example, in the second treatment zone II there are several bellows pumps 97, only one of which is shown in FIG. 3. In the third treatment zone III, there is a single bellows pump 98. Each of the bellows pumps 97 and 98 is connected via a linkage and a cam 99 to a drive for the various squeeze, deflecting and transport rollers. Thus, the drive of the bellows pumps 97, 98 for applying the treatment fluids takes place synchronously with the roller drive, since it is derived from this. As indicated in FIG. 3 by dot-and-dash lines starting from the outflow pipelines of the bellows pumps 97 and 98, respectively, these outflow pipelines are connected to the spray tubes 60, 61 and 62, 63 or to the channel 64, respectively, so as to feed these with the particular treatment fluid. An essential advantage of the bellows pumps is that, when the portable insert is taken out of the treatment zone, neither electrical plugs in the wet region nor hose couplings need to be detached. Furthermore, because the drive of the bellows pumps is derived from the roller transport drive, an application of fluid which is proportional to the material feed speed takes place. According to FIG. 3, the pair of deflecting rollers 51, 52 is located within the fluid-coating chamber 53, with the lower deflecting roller 52 dipping into the fluid bath. An arrangement of this type is expedient, above all, when the developer adheres strongly to the material 14 to be developed, especially to printing plates. Then, pre-cleaning of the printing plate is already carried out, for example, by means of the pair of deflecting rollers 51, 52, before rinsing water is applied to the printing plate by the spray tubes 60 to 63. It is also possible, of course, for the deflecting rollers 51, 52 to be located outside the fluid-coating chamber 53, as in the embodiment according to FIG. 2.

FIGS. 4 and 4A show the channel 64 of the third treatment zone III and a sectional view along the line N-N' of the channel arrangement. An inflow tube 74 projects into the V-shaped channel 64 from both ends respectively, only one of these inflow tubes 74 being shown in FIG. 4. It goes without saying that only a single inflow tube 74 of this type need be provided. As already mentioned, the inflow tubes 74 are connected to the outlet pipeline of the pump 70 or of the bellows pump 98.

Figure 5:
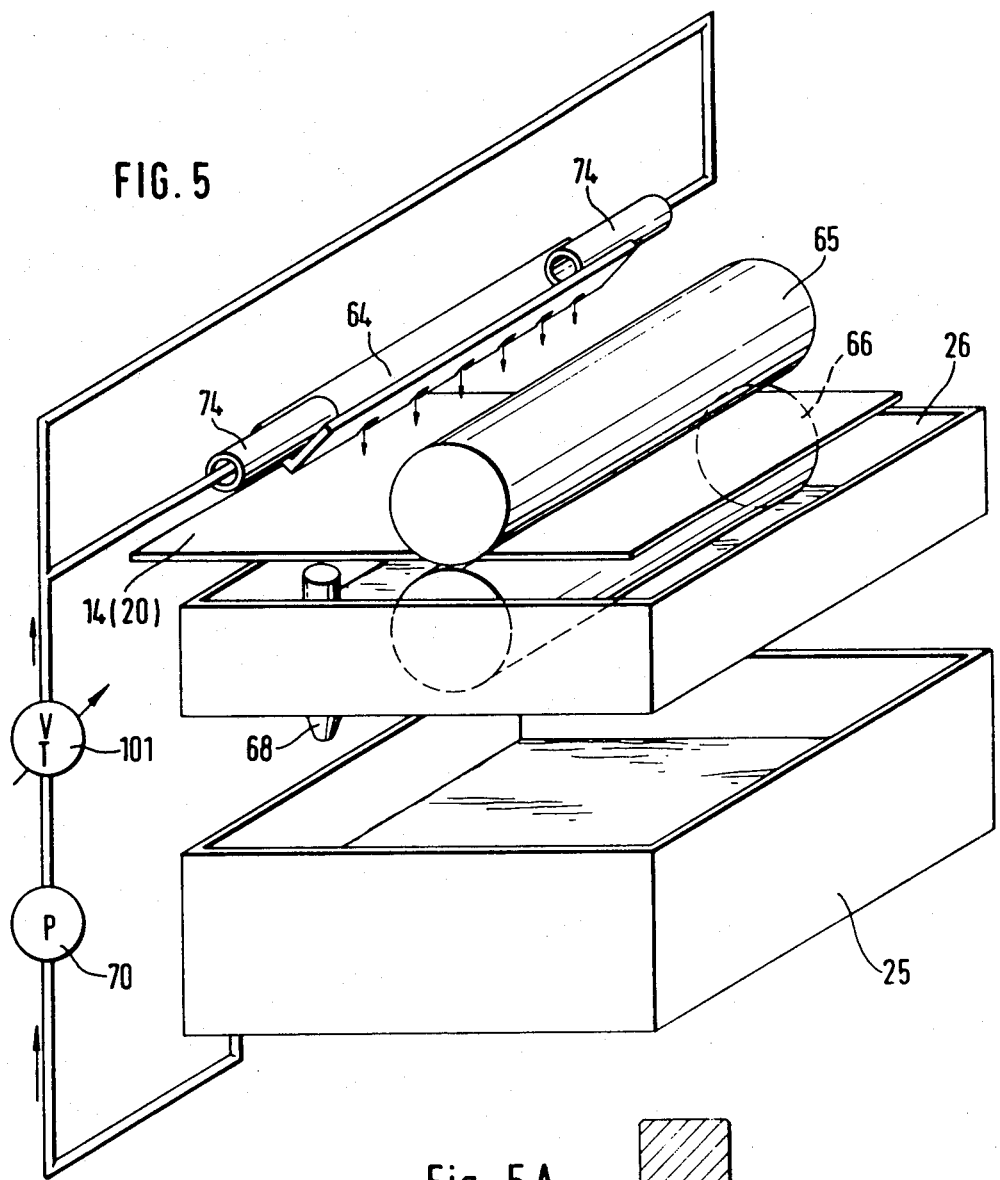
Figure 5 is a perspective representation of one of the treatment zones of the processing unit.
Figure 5A:
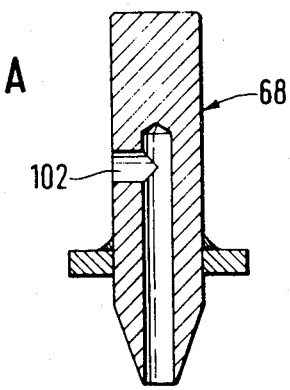
FIG. 5A is a detailed cross-sectional view of one element in FIG. 5.

FIG. 5 shows diagrammatically and in perspective the third treatment zone III of the processing unit 1 according to the embodiment of FIG. 2. The inflow tubes 74 project into the channel 64 from both sides, and these can be, for example, hose connections with pipe pieces soldered in. A part of the material 14 and the material path 20, respectively, through the rollers 65, 66 is shown. The material is moved along the material path 20 and passes through the gap between the run-out rollers 65 and 66 which squeeze the treatment fluid off from the developing material. The lower run-out roller 66 dips into the treatment fluid. The plug 68 can be extracted from the tank 26 to allow the treatment fluid to flow off into the tank 25 located underneath, so that the empty tank 26 can be cleaned or the treatment fluid can be changed. The plug 68 has the lateral drain port 102, by means of which the fluid level in the tank 26 is kept constant. From the bottom of the tank 25, a pipeline leads to the pump 70, the outlet side of which is connected to the inflow tubes 74 via a throttle valve 101 for limiting the fluid stream. The section through the plug 68 shown enlarged in FIG. 5A illustrates the lateral position of the drain port 102.

Figure 6:
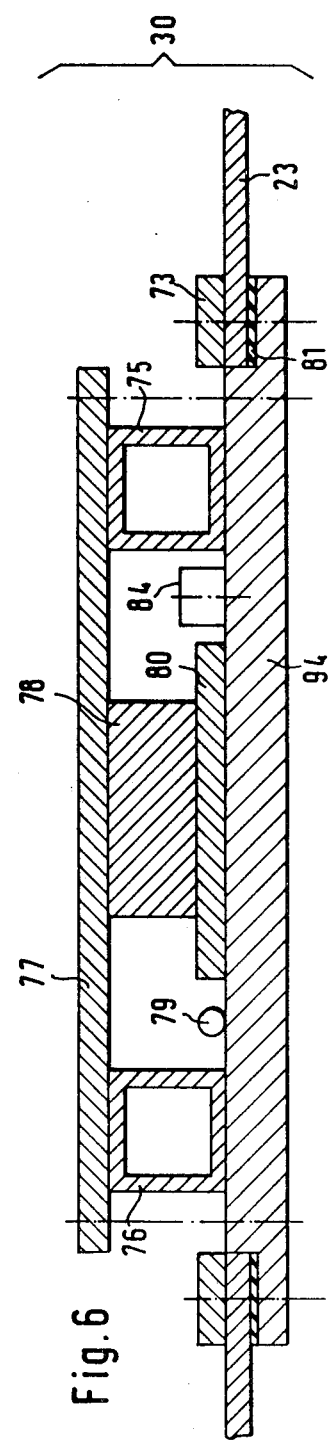
FIG. 6 is a cross-sectional view taken through a heating device of the processing unit.

Details of the heating device 30 are shown in FIG. 6. A heat-exchange plate 94 of the heating device 30 is inserted into an orifice in the tank bottom part 23. The mechanical connection between the heat-exchange plate 94 and the tank bottom part 23 is made by providing gaskets 81 between a shoulder of the heat-exchange plate 94 and the underside of the tank bottom part 23 and by arranging above them on the top side of the tank bottom part 23 threaded strips 73, by means of which a screw connection is made between the tank bottom part 23 and the heat-exchange plate 94. Resting centrally on the heat-exchange plate 94 is an electrical heating plate 80 which carries in intermediate block 78 on which an adapter plate 77 rests. Underneath and near to the edge of the adapter plate 77 run the cooling channels 75, 76 which can be connected to the fluid bath in the second treatment zone II. A thermostat 79 controls the heating capacity of the heating device 30 according to the set temperature value. An overheating protection 84 is provided to prevent overheating of the heating plate 80.

Figures 7A, 7B:
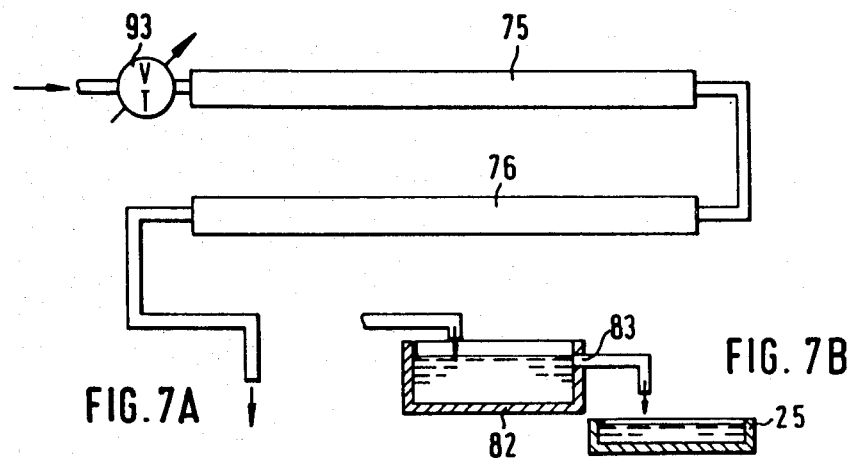
Figure 7A and 7B schematically illustrate the path of the water-cooling system of the heating device according to FIG. 6.
Figure 8:
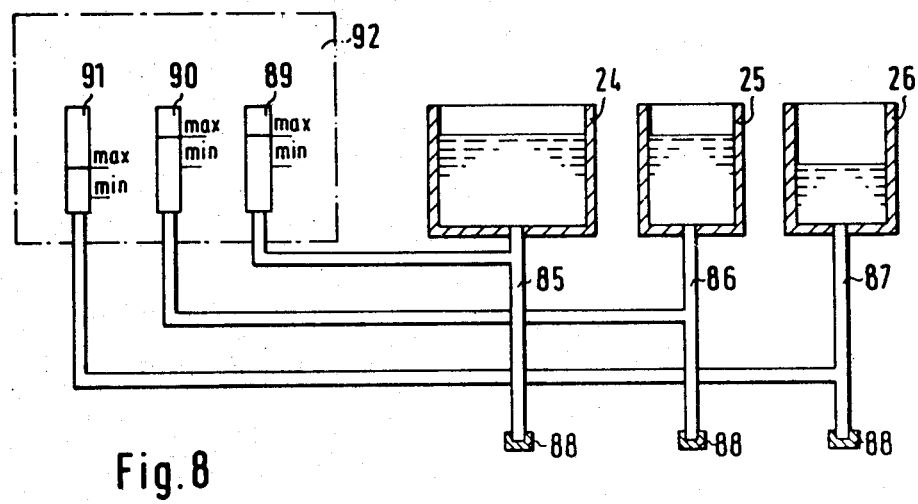
FIG. 8 is a diagrammatic view of the filling level indications of the processing unit.

As is evident from FIG. 7, a throttle valve 93 for controlling the quantity of cooling water is located in front of the cooling channel 75. The cooling water flows either directly into the drain, as indicated in FIG. 7A, or into a rinsing water tank 82 which has an overflow 83 for keeping the fluid level constant, and from this rinsing water tank 82 into the tank 25 in the second treatment zone II, as is evident from FIG. 7B.

The filling level in the individual tanks 24, 25, 26 is indicated via filling-level indicators 89, 90, 91 which are connected to the drain hoses 85, 86, 87 of the tanks 24, 25, 26 on the principle of communicating tubes. The filling-level indicators 89, 90, 91 are integrated into the filling-level indicator panel 92 which is located on the front plate of the processing unit 1. Each of the filling-level indicators is equipped with a marking for a maximum and minimum filling level. Plugs 88 in the drain hoses 85, 86, 87 are removed for changing the fluid baths in the tanks 24, 25, 26.

What is claimed is:

1. A processing unit for photosensitive materials which have been exposed imagewise, comprising:
    an integral tank bottom member having at least three recesses and tank inserts inserted in said recesses to form three separate tanks to define three separate treatment zones for the photosensitive materials, one treatment zone in each tank, said tanks being adapted to receive and hold a treatment fluid for each treatment zone;
    means positioned in each of said treatment zones for applying a treatment fluid to both the top and bottom sides of the photosensitive material, wherein the applying means in the first treatment zone includes a cover which projects partially into the treatment fluid contained in the first tank;
    means, attached to said inserts which are selectively removable from each of said tanks, for transporting and guiding the photosensitive material through said treatment zones in a continuous manner, said guiding and transporting means including means for guiding the photosensitive material in a substantially straight line in the region of said means for applying treatment fluid in each of said treatment zones; and
    a housing top part having two separate feed slits for the photosensitive material, and first and second run-in tables inclined obliquely downwardly, said first run-in table being positioned to feed the photosensitive material via a first feed slit to said first treatment zone, and said second run-in table being positioned to transport the photosensitive material via the second feed slit to said second treatment zone.

2. The processing unit as claimed in claim 1, wherein the inclination of the first and second run-in tables relative to the horizontal is from about 5° to 25°, wherein said first run-in table is hingedly connected to said housing top part so that it can be swung down against the housing top part, and wherein said second run-in table is an integral part of said housing top part.

3. The processing unit as claimed in claim 1, further comprising a pre-chamber located in said tank bottom member adjacent the first treatment zone and separated therefrom by a separating wall between the pre-chamber and the fluid bath of the first treatment zone, at least one selectively closable orifice in said separating wall and a pair of feed rollers located in said pre-chamber.

4. The processing unit as claimed in claim 1, said transporting and guiding means defines a photosensitive material path which runs in a curve to the lowest point of the fluid bath in the first treatment zone and is directed obliquely upwardly in a straight line from said lowest point.

5. The processing unit as claimed in claim 4, wherein said treatment fluid applying means in the first treatment zone includes two brushing rollers, a counter-roller associated opposite each brushing roller, said brushing rollers being located respectively underneath and above the photosensitive material, wherein the brushing rollers revolve at a predetermined speed different from the photosensitive material transport speed, and wherein said cover covers the fluid bath between a first pair of transport rollers located in said first treatment zone and the brushing roller located rearmost in the transport direction, whereby air entrainment by the brushing roller is prevented.

6. The processing unit as claimed in claim 5, wherein said cover comprises a horizontal part and an upwardly inclined sloping part surrounding the brushing rollers and their counter-rollers.

7. The processing unit as claimed in claim 4, wherein the tank bottom member of the first treatment zone includes in the tank bottom underneath the brushing rollers a heating device which contains cooling channels for water-cooling.

8. The processing unit as claimed in claim 7, wherein the cooling channels are connected to the fluid in the tank insert of the second treatment zone.

9. The processing unit as claimed in claim 5, further comprising in the second treatment zone a fluid-coating chamber for the treatment fluid, through which the photosensitive material is passed centrally and horizontally, said fluid-coating chamber including two pairs of spray tubes, the first being located near the entrance and the second pair being located near to the exit of the fluid-coating chamber, and a pair of squeeze rollers attached between the two pairs of spray tubes.

10. The processing unit as claimed in claim 9, wherein one of the spray tubes of the two pairs is located above and one below the photosensitive material path and wherein one squeeze roller is located below the photosensitive material path and is adapted to dip into the fluid bath.

11. The processing unit as claimed in claim 9, further comprising means, including a pump, for supplying treatment fluid from the second treatment zone tank to said spray tubes.

12. The processing unit as claimed in claim 9, further comprising in the third treatment zone above the photosensitive material path, a channel having a V-shaped cross-section with a plurality of slits at the bottom for the application of treatment fluid to the photosensitive material.

13. The processing unit as claimed in claim 12, further comprising in the third treatment zone after said channel, squeeze rollers positioned below and above the photosensitive material path, wherein the lower squeeze roller dips into the fluid bath of the third treatment zone tank to coat treatment fluid onto the underside of the photosensitive material, and further comprising a collection tank positioned beneath said squeeze rollers to collect the excess treatment fluid.

14. The processing unit as claimed in claim 13, further comprising means, including a pump, for supplying treatment fluid from the third treatment zone tank to the channel.

15. The processing unit as claimed in claim 14, wherein the collection tank includes a bottom drain which drains into the third treatment zone tank, and a plug having a drain port, said plug being positioned in the bottom drain.

16. The processing unit as claimed in claim 14, wherein the collecting tank has a drain orifice in its bottom wall, the cross-section of said orifice being such that the quantity of treatment fluid flowing out through the orifice is less than the quantity of treatment fluid flowing into the collecting tank via the channel.

17. The processing unit as claimed in claim 14, further comprising means for driving said pumps by said guiding and transporting means, and wherein all rollers of said guiding and transporting means, with the exception of the brushing rollers, revolve at a peripheral speed equal to the feed speed of the photosensitive material, and wherein the drive means for said pumps is synchronous with the rollers.

18. The processing unit as claimed in claim 1, further comprising a ventilation fan located in the lower part of said unit, and means for guiding the air stream from said fan along underneath the tank bottom member and for directing the air stream upwardly, out of the processing unit in the region of a run-out table for the processed photosensitive material.

19. The processing unit as claimed in claim 18, wherein the run-out table has an opening which extends over its entire width and through which the air stream from the ventilation fan flows against the underside of the material, and wherein the run-out table includes an adjustable stop for the front edge of the material, which stop is positioned so that the rear edge of the material comes to rest over said opening.

20. The processing unit as claimed in claim 13, wherein several pumps or a single pump are located in the liquid baths of the second and third treatment zones, respectively, wherein each pump is connected via a linkage and a cam to a drive for the rollers of the various pairs of rollers, and wherein the pressure sides of the pumps in the second and third treatment zones are connected to the spray tubes or to the inflow tubes to the channel respectively.

* * * * *

UNITED STATES PATENT AND TRADEMARK OFFICE
CERTIFICATE OF CORRECTION

PATENT NO. : 4,464,035
DATED : August 7, 1984
INVENTOR(S) : Eberhard SCHOERNIG

It is certified that error appears in the above—identified patent and that said Letters Patent is hereby corrected as shown below:

On the Title page, Applicant's name should read:

-- SCHOERNIG -- in two instances.

Signed and Sealed this

Nineteenth Day of February 1985

[SEAL]

Attest:

DONALD J. QUIGG

*Attesting Officer*          *Acting Commissioner of Patents and Trademarks*